(12) United States Patent
Kato

(10) Patent No.: US 7,403,435 B2
(45) Date of Patent: Jul. 22, 2008

(54) MEMORY UNIT AND SEMICONDUCTOR DEVICE

(75) Inventor: Kiyoshi Kato, Kanagawa (JP)

(73) Assignee: Semiconductor Energy Laboratory Co., Ltd., Atsugi-Shi, Kanagawa-Ken (JP)

( * ) Notice: Subject to any disclaimer, the term of this patent is extended or adjusted under 35 U.S.C. 154(b) by 0 days.

(21) Appl. No.: 11/685,314

(22) Filed: Mar. 13, 2007

(65) Prior Publication Data
US 2007/0147165 A1    Jun. 28, 2007

Related U.S. Application Data

(63) Continuation of application No. 10/849,217, filed on May 20, 2004, now Pat. No. 7,200,050.

(30) Foreign Application Priority Data
May 26, 2003    (JP)    ............................. 2003-148181

(51) Int. Cl.
    *G11C 5/14*    (2006.01)
(52) U.S. Cl. ........................... 365/189.09; 365/230.05; 365/226

(58) Field of Classification Search ............ 365/189.09, 365/230.06, 226
See application file for complete search history.

(56) References Cited

U.S. PATENT DOCUMENTS

| 5,726,930 | A | 3/1998 | Hasegawa |
| 5,737,275 | A | 4/1998 | Matthews |
| 6,269,047 | B1 | 7/2001 | Kohno |
| 2002/0130341 | A1* | 9/2002 | Horiguchi et al. ........... 257/296 |
| 2002/0153844 | A1 | 10/2002 | Koyama |
| 2004/0246765 | A1 | 12/2004 | Kato |

FOREIGN PATENT DOCUMENTS

| EP | 1 063 630 | 12/2000 |
| JP | 2001-005426 | 1/2001 |

* cited by examiner

*Primary Examiner*—Huan Hoang
(74) *Attorney, Agent, or Firm*—Fish & Richardson P.C.

(57) ABSTRACT

A memory unit that is capable of operating in a desired operation condition with less power consumption, and a semiconductor device using the memory unit. The memory circuit comprises a cell array in which a plurality of memory cells is arranged, a driver circuit, a plurality of selection circuits each of which includes a memory circuit, and a power source circuit. A plurality of potentials is supplied to each of plurality of selection circuits from the power source circuit, each of plurality of selection circuits selects a potential among the plurality of potentials in accordance with data stored in each memory circuit, and the selected potential is supplied to a memory cell corresponding to each of the plurality of selection circuits among the plurality of memory cells by a signal output from the driver circuit.

50 Claims, 10 Drawing Sheets

FIG. 6A  Program
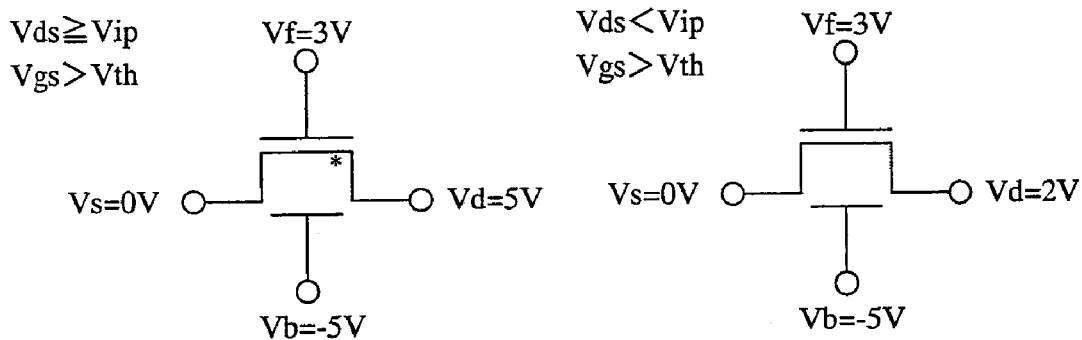
FIG. 6B  Hold
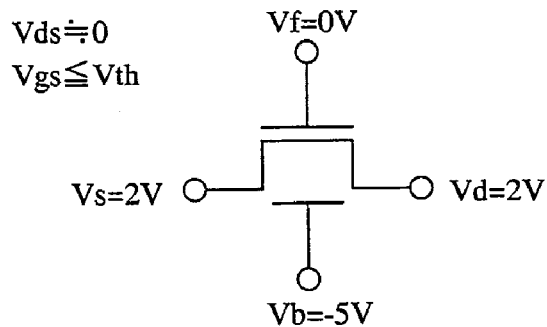
FIG. 6C  Read
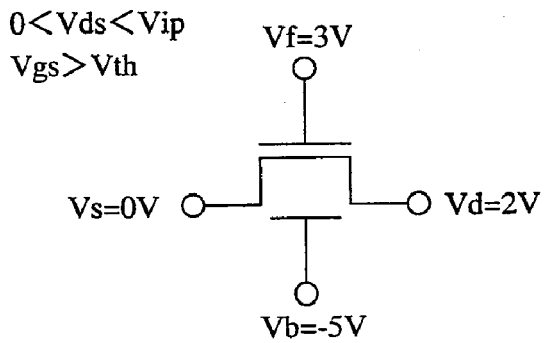
FIG. 6D  Purge
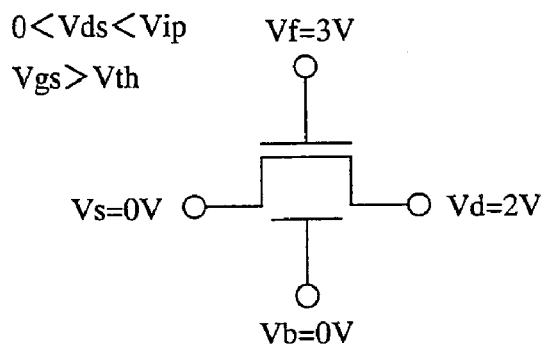

MEMORY UNIT AND SEMICONDUCTOR DEVICE

This is a continuation of application Ser. No. 10/849,217, filed May 20, 2004, now U.S. Pat. No. 7,200,050.

BACKGROUND OF THE INVENTION

1. Field of the Invention

The present invention relates to a memory unit having a characteristic correcting function and to a semiconductor device to which the memory unit is mounted.

2. Description of the Related Art

A semiconductor memory (abbreviated to a memory, hereinafter) is a typical memory unit which is configured mainly by a MOS transistor, and has advantages in that it is capable of operating at a higher speed than a magnetic recording medium, does not require a mechanical driving part, few breakdowns occur, the lifetime is long and the like. Included in the typical memories are a DRAM (Dynamic Random Access Memory) and an SRAM which are volatile memories, and a masked ROM, an EPROM, an EEPROM, a flash memory, and a ferroelectric memory which are nonvolatile memories and the like. These memories each of which is formed using a single crystalline semiconductor substrate have already been put into practice and abundantly available in the market. Recently, a technology for monolithically forming an integrated circuit and a pixel portion onto a glass substrate, namely a system-on-panel has been expected to be advanced in a flat panel display which is formed by using an inexpensive glass substrate. Accompanied by this, a study of the practical application of a memory using a thin semiconductor film has been promoted.

There are various kinds of memories as described above and in each memory, generally, a memory cell is disposed at an intersection area of a word line and a bit line. Provided in the memory cell are a memory element and, in many cases, a switching element for controlling writing data into the memory element. By selecting certain word line and bit line, each memory cell is selected and writing and reading of data can be performed.

SUMMARY OF THE INVENTION

As for semiconductor elements using a single crystalline semiconductor substrate, variation in characteristics in the same substrate is small while variation in characteristics between substrates or lots is relatively large in many cases. A memory has the same problem. In the case where memories are formed in different lots and on different substrates, characteristics of switching elements or memory elements tend to vary between chips. In addition, the characteristics may vary with time even in the same chip due to the heat generated by an integrated circuit and the like or to deterioration with the passage of driving time.

On the other hand, as for a memory formed by using a thin semiconductor film, characteristics of a semiconductor elements used as switching elements vary more often than that using a single crystalline semiconductor substrate, and the uniformity of the characteristics is difficult to obtain not only between chips but also in a chip.

A thin film transistor (TFT) which is a typical semiconductor element can be realized higher mobility and larger on-current when it is formed with a polycrystalline semiconductor film than formed with a non-crystalline semiconductor film. Writing and reading of data at a higher speed can be therefore realized in a memory cell by using a TFT formed with polycrystalline semiconductor film as a switching element. However, variations in characteristics of the mobility, the threshold voltage, and the like tend to occur due to defects in a grain boundary.

As described above, in the memory formed with a thin semiconductor film, the characteristics of a switching element or a memory element tend to vary between memory cells included in a cell array in the same chip. In addition to the variations within the cell array, characteristic change with time within the same chip due to environment such as temperature or deterioration also occurs like in the memory using a single crystalline semiconductor substrate.

When characteristics of the switching element or the memory element are varied, a series of operations including data writing, holding, and reading may be interfered. For example, in a certain memory cell, data may not be written or stored adequately to be erased, or accurate data reading may not be performed because it takes a long time to read the data. Thus, a specification of the chip is generally determined so that the series of operations is generally performed in all memory cells without fail when operating the memory practically. A power source has a determined specification generally and the chip needs to be designed with a margin so as to operate a memory cell whose characteristic is most deteriorated.

However, the potential of the word line is common in a plurality of memory cells or in all memory cells which compose a cell array. Therefore, when the potential of the word line is determined based on a memory or a memory cell whose characteristic is deteriorated, the absolute value of the potential of the word line is too large for the other memories or memory cells, leading to unnecessarily increased power consumption. In some cases, that too large absolute value of the potential of the word line may cause the deterioration of characteristics of a switching element or a memory element in a memory or a memory cell whose characteristics are preferable rather than deteriorated. This tendency is likely to be seen when variation in characteristics is larger.

In view of the foregoing, it is the primary object of the present invention to provide a memory unit that is capable of operating in a desired operation condition while suppressing the power consumption, and a semiconductor device using the memory unit.

For solving the foregoing problems, provided in a memory according to the present invention are a selection circuit for selecting a power source potential for operating the memory cell among a plurality of potentials, and a power source circuit for supplying the plurality of potentials to the selection circuit. The selection circuit includes a memory circuit for storing data of a potential to be selected.

Hardware used for the optimization of potential is not limited to the selection circuit and the power source circuit. A decoder and a selector for selecting a memory circuit and writing data may be provided in a memory. The decoder and the selector are not necessarily provided in the memory, and they may be connected to a CPU as a memory interface chip to control each hardware for performing the optimization in one or a plurality of memories.

According to the present invention, an optimum potential for operating a memory in a desired operation condition is selected and set by the hardware such as the selection circuit or the power source circuit provided in the memory.

A series of operations for setting the optimum potential is controlled by software using a CPU (Central Processing Unit). Specifically, a potential to be selected among the plurality of potentials is changed by rewriting data stored in the memory circuit. In this manner, an operation state of a memory cell is figured out when the selected potential is supplied to the memory cell. Viewing the operation state, an optimum potential corresponding to a desired operation condition is selected and data of the selected potential is stored in the memory circuit to set the potential. The potential optimization in a matrix memory is performed per column or row to which the potential is supplied from a common wiring, based on a memory cell whose characteristic is most deteriorated. When operating the memory practically, the optimum potential can be selected by the selection circuit and supplied to a memory cell.

For example, in the case of optimizing a potential of a word line, a plurality of potentials to be supplied from the power source circuit to the selection circuit are selected and supplied to each word line to operate each memory cell. In this manner, a potential for operating the memory cell in a desired operation condition is picked out by software. When operating the memory practically, the picked out optimum potential is selected by the selection circuit and supplied to the word line.

It is to be noted that, not only the potential of the word line but also a precharge potential and a power source potential to be supplied to each memory cell, namely all signal potentials and power source potentials which relate to a memory operation, can be optimized. In this case, a selection circuit is provided to a corresponding wiring for supplying to a memory cell the potential of the signal or the power source potential to be optimized. By controlling a potential of the signal or the power source by software as described above, access time of the memory cell and power consumption can be also optimized.

The plurality of potentials supplied to the selection circuit from the power source circuit may be fixed, however, the plurality of potentials themselves may be changed by optimization. In this case, a memory circuit for storing the plurality of potentials as data is provided in the power source circuit, and the data written to the memory circuit is rewritten in optimizing.

An operation condition required for the optimization can be appropriately selected by a user, and the optimum potential may differ depending on the required operation condition. The operation condition is not limited to one and a plurality of operation conditions can be satisfied in optimizing. The operation condition is represented by a power consumption, an operating speed, a proportion of memory cells which do not operate normally and the like, however, the optimization can be performed so as to meet other operation conditions.

In a memory using a single crystalline semiconductor substrate, variations in characteristics between the memories formed on different substrates are not small while variations in characteristics between memory cells in the same memory are within the allowable range in some cases. In this case, an optimization of a potential supplied to a plurality of memories can be performed without checking the operation per memory cell. Figured out roughly characteristics of the whole memory by only checking the operations of one or a plurality of memory cells selected as samples, the potential that is common in all the memories may be optimized for example. In addition, the selection circuit is not necessarily provided for each word line. One selection circuit may be provided for all the word lines.

It is to be noted that, any matrix memory such as a masked ROM, a DRAM, an SRAM, an EPROM, an EEPROM, a flash memory, and a FRAM may be applied to a memory of the present invention.

With the above-mentioned configuration, it is possible to suppress variations in characteristics between memory cells in a memory or between memories on different chips. Further, according to the present invention power consumption can be suppressed and a potential can be optimized in accordance with the operation condition. It is also possible to suppress the deterioration of characteristics of a switching element or a memory element caused by supplying too high or too low potential.

The memory of the present invention comprises a selection circuit, a power source circuit and the like as hardware for the potential optimization, which is performed by software with a CPU. In the case where a series of operations for optimization is not controlled by a program but by dedicated hardware, large-scale and complex hardware is necessarily provided in the memory. In this case, it is difficult to reduce the size of a semiconductor device and the power consumption as the function of potential optimization is provided. Therefore, it is not realistic. In addition, since different hardware is required to be provided in accordance with user needs, it has poor versatility. In the present invention, by utilizing hardware partially and controlling the optimization operation by software, the configuration of a memory can be simplified, the optimization corresponding to the operation condition can be performed much more freely, and the power consumption can be suppressed as compared with the case where the optimization is performed only by hardware.

It is to be noted that, the semiconductor device of the present invention includes all semiconductor devices such as a microprocessor, an image processing circuit, and a semiconductor display device to which a semiconductor memory is applicable. The semiconductor display device includes a liquid crystal display device, a light emitting device comprising a light emitting element represented by an organic light emitting diode (OLED) in each pixel, a DMD (Digital Micromirror Device), a PDP (Plasma Display Panel), an FED (Field Emission Display), and other display devices in which circuit elements using semiconductor films are employed in their driver circuits.

The memory of the present invention comprises a selection circuit and a power source circuit as hardware for the correction, and the correction of characteristics of a cell array using the selection circuit and the power source circuit is performed by controlling the selection circuit and the power source circuit by software. By utilizing hardware partially and performing the correction by software as described above, optimization corresponding to the operation condition can be performed more freely and the configuration of the memory can be simplified as compared with the case where the correction is performed only by hardware.

BRIEF DESCRIPTION OF THE DRAWINGS

FIGS. 6A to 6D are diagrams showing operations of a memory element provided in the memory cell shown in FIG. 4.

DETAILED DESCRIPTION OF THE PRESENT INVENTION

Embodiment Mode 1

A configuration of a memory according to the present invention will be explained using FIG. 1. A memory shown in FIG. 1 is a DRAM and explained is one embodiment mode in which a potential of a word line is optimized.

Figure 1:
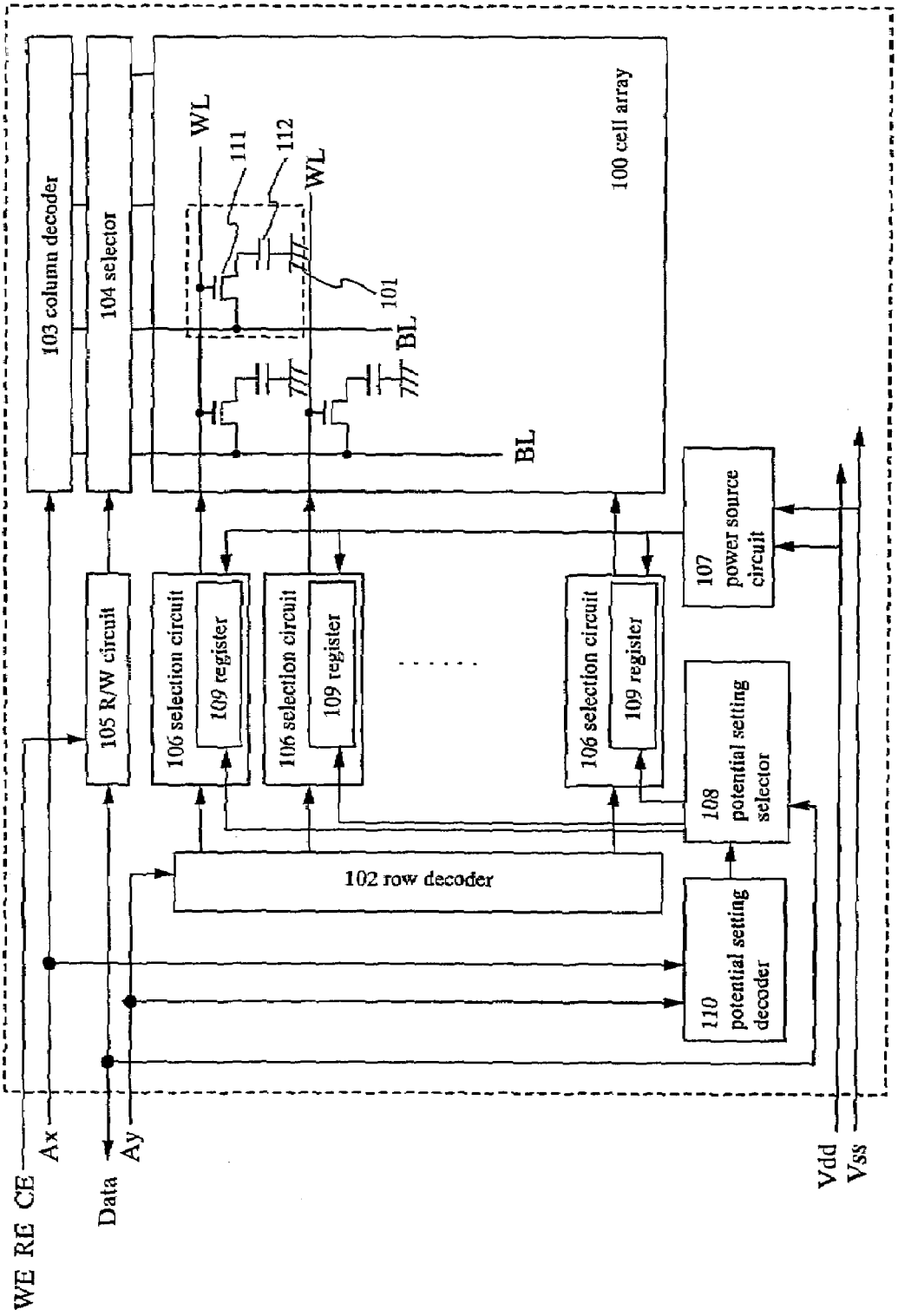
FIG. 1 is a configuration diagram of a memory unit of the present invention.

In the memory in FIG. 1, reference numeral 100 denotes a cell array in which a plurality of memory cells 101 are arranged in matrix. Each memory cell 101 comprises a word line WL, a bit line BL, a transistor (pass transistor) 111 that serves as a switching element, and a capacitor 112. Reference numeral 102 denotes a row decoder, 103 denotes a column decoder, 104 denotes a selector, 105 denotes a R/W circuit, 106 denotes a selection circuit, and 107 denotes a power source circuit. The selection circuit 106 comprises a register 109 which serves as a memory circuit. The row decoder 102, the column decoder 103, the selector 104, and the R/W circuit 105 correspond to driver circuits for controlling the operation of the memory cell 101. Reference numeral 108 denotes a selector for the register 109 and referring to as a potential setting selector 108 in distinction to the selector 104. Reference numeral 110 denotes a decoder for the register 109 and referring to as a potential setting decoder 110 in distinction to the row decoder 102. Power supply voltages Vdd and Vss (Vdd>Vss) are supplied to the power source circuit 107.

An address (Ax, Ay) including the address as data is input to a memory chip. Then, the address Ax is input to the column decoder 103 and the corresponding bit line BL is selected by the selector 104. The address Ay is input to the row decoder 102 and the corresponding word line WL is selected. In each memory cell 101, ON/OFF of the pass transistor 111 is controlled by a potential of a signal supplied to the word line WL. When the word line WL is selected and the pass transistor 111 is turned ON, data (Data) is written to or read from the capacitor 112 through the selected bit line BL.

Whether writing or reading data is selected by signals such as RE (Read enable) and WE (Write enable) supplied to the R/W circuit 105. It is to be noted that a signal CE (Chip enable) for selecting a chip in which the memory is formed (a memory chip) may be input to the R/W circuit 105. When writing is selected by the signal RE or WE, data is written through the bit line BL selected by the selector 104 and when reading is selected by the signal RE or WE, data is read through the bit line BL selected by the selector 104.

In this embodiment mode, a plurality of potentials are supplied to the selection circuit 106 from the power source circuit 107. The selection circuit 106 selects a certain potential among the plurality of potentials in accordance with data stored in the register 109 and supplies the potential to the word line WL selected by the row decoder 102. This data for selecting a potential is hereinafter referred to as selection data in distinction to data to be written to a memory cell. The potential selected by the selection circuit 106 can be changed by rewriting the selection data stored in the register 109. Specifically, when an address assigned to the register 109 is input to a memory chip, the register 109 is selected by the potential setting decoder and the potential setting selector, and selection data is written to the register 109.

Explained next will be a series of operations for optimizing a potential of a word line in order to reduce power consumption of the memory shown in FIG. 1. A potential of the word line has different two values between when selected and when not selected, both of which potentials can be optimized. Explained in this embodiment mode is an optimization of a potential of the word line when selected, namely a potential for turning ON the pass transistor 111.

Figure 2:
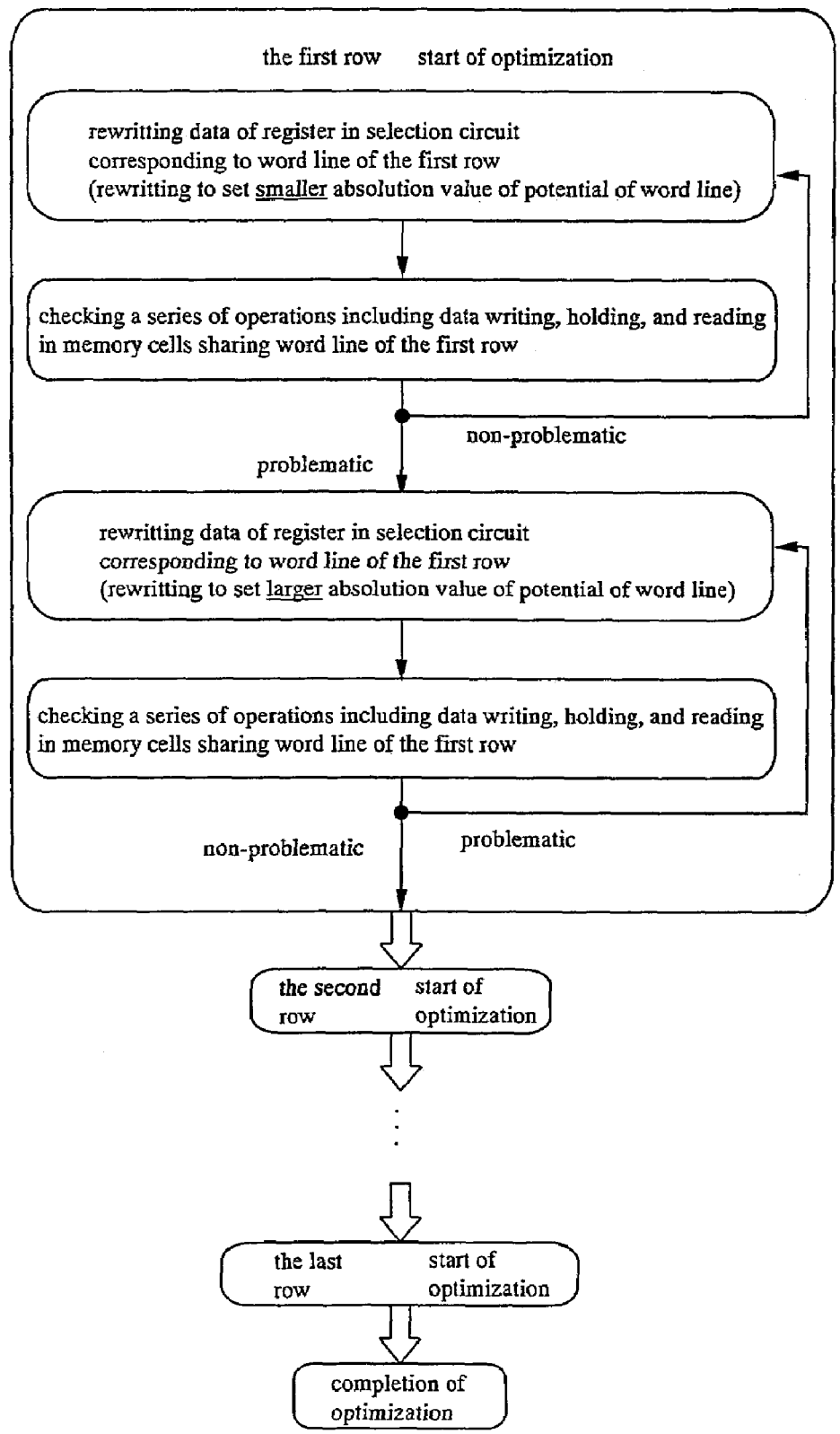
FIG. 2 is a flowchart showing an operation flow in the memory unit of the present invention.

FIG. 2 is an example of a flowchart of the optimization for reducing power consumption of the memory. Firstly, a potential supplied to a word line of the first row is optimized as shown in FIG. 2. That is, in the selection circuit 106 corresponding to the word line, selection data of the register 109 is rewritten to set small the absolute value of the potential of the word line when selected. The absolute value of the potential of the word line may be decreased one-by-one, or decreased by two or more here.

Next, a series of operations including data writing, holding, and reading is performed in the memory cells 101 sharing the word line of the first row by using the set potential of the word line. In each of the memory cells sharing the word line of the first row, whether written data matches read data or not is checked to judge whether the operation has problem or not. The judgment benchmark of whether the operation has problem or not can be properly set in accordance with an operation condition set by a user. For example, the case where written data matches read data in all memory cells sharing the word line of the first row may be judged non-problematic, while the case where written data does not match read data in at least one memory cell of the memory cells sharing the word line of the first row may be judged problematic. Instead, the case where written data matches read data in a fixed rate memory cells or more among all the memory cells sharing the word line of the first row may be judged non-problematic.

When the operation is judged non-problematic, the selection data is rewritten again so as to have a smaller absolute value of a potential of the word line of the first row, and whether an operation has problem or not is judged. On the other hand, when the operation is judged problematic, the selection data stored in the register is rewritten in the selection circuit corresponding to the word line of the first row so as to have a larger absolute value of a potential of the word line. The absolute value of the potential of the word line may be increased one-by-one, or increased by two or more here. However, the absolute value of the potential of the word line is set to be increased in a narrower range than the decreased one.

Then, a series of operations including data writing, holding, and reading is performed in the memory cells 101 sharing the word line of the first row and whether the operation has problem or not is judged. That is, whether written data matches read data or not is checked to judge whether the operation has problem or not. The judgment benchmark of whether the operation has problem or not can be properly set in accordance with an operation condition set by a user.

When the operation is judged problematic, the absolute value of the potential is increased further. When the operation is judged non-problematic, the potential is set as the most optimum value and optimization of a potential to be supplied to the word line of the first row is completed.

Subsequently, potentials supplied to word lines of the second row and the subsequent rows are optimized in the same manner and optimization of potentials of all word lines is completed finally. A memory can be operated with less power consumption by the optimization described above.

The case of optimizing the potential of the word line for an operation condition of power consumption reduction is explained using FIG. 2, however, the optimization may be performed for an operation condition of higher operation speed of a memory. Using FIG. 3, explained next will be a series of operations for optimizing the potential of the word line in order to increase the operation speed of a memory.

Figure 3:
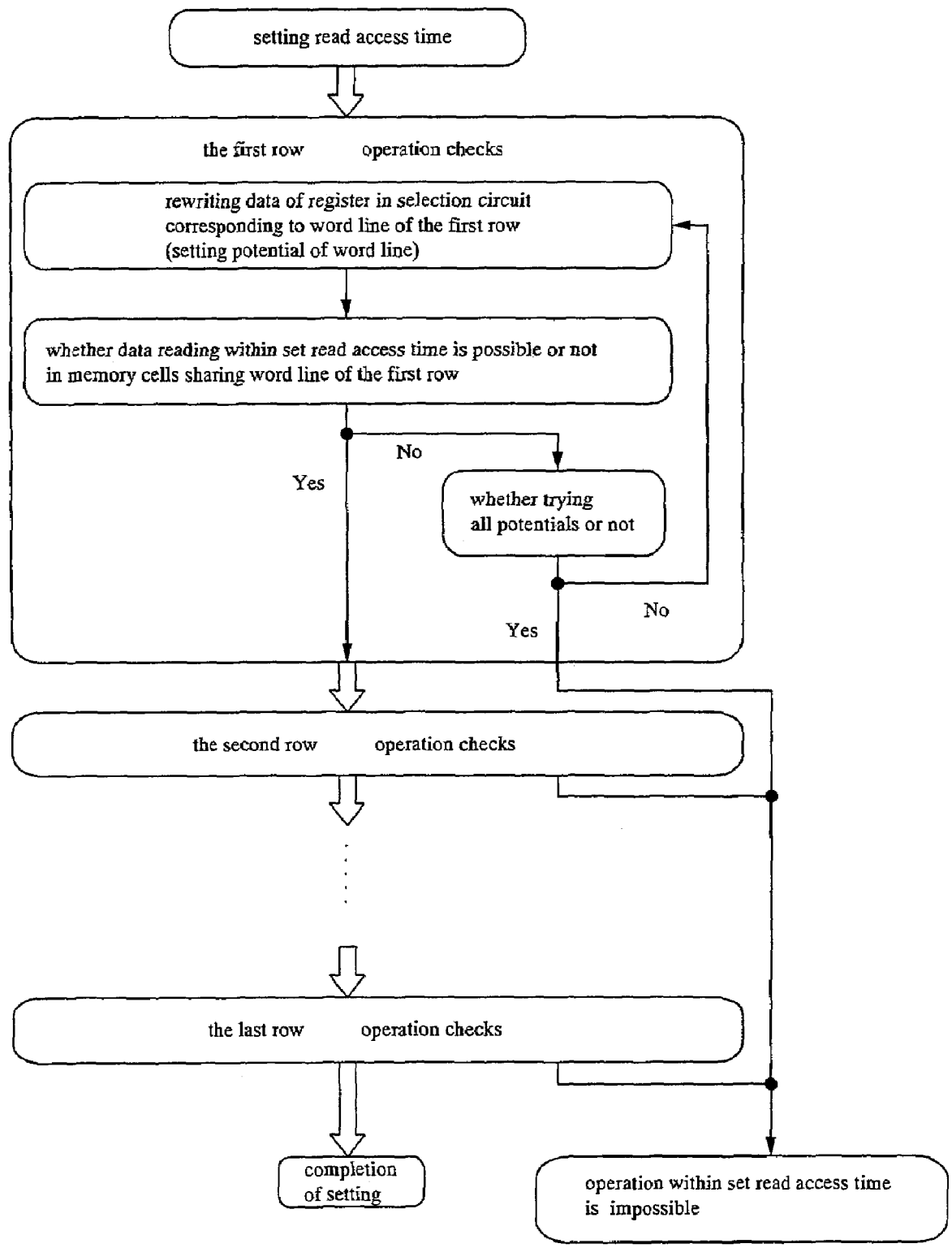
FIG. 3 is a flowchart showing an operation flow in the memory unit of the present invention.

FIG. 3 is a flowchart of the optimization for increasing the operation speed of a memory. Typically, a memory takes a longer time to read data than to write data. The key point for realizing higher operation speed is, therefore, to shorten a time required for data reading (hereinafter, referred to as read access time). In this embodiment mode, a read access time for operating the memory at a desired speed is set firstly. Then, checked is whether, data reading within the read access time is possible in all memory cells or not.

Specifically, the read access time is set and then a potential to be supplied to the word line of the first row is set. Subsequently, in memory cells 101 sharing the word line of the first row, data is written and then the data is read. The written data and the read data are compared with each other after the read access time terminates to judge whether data reading within a set read access time is possible or not. The judgment benchmark of whether data reading is possible or not can be properly set in accordance with an operation condition set by a user. For example, the data reading may be judged possible only in the case where written data matches read data in all the memory cells sharing the word line of the first row, or in the case where written data matches read data in of a fixed rate memory cells or more among all the memory cells sharing the word line of the first row.

When the data reading is judged impossible, the potential supplied to the word line of the first row is reset and the operation of data writing and data reading is checked again. In the case where the data reading is judged impossible even after trying all the potentials supplied from the power source circuit 107, an operation within the set read access time is found impossible. Therefore, the read access time may be reset longer and the operation of data writing and data reading may be checked again.

It is to be noted that, in the case where there is the operation condition of reduction in power consumption in addition to the operation condition of higher operation speed, a potential capable of suppressing more power consumption can be obtained by sequentially selecting a potential of the word line from the lowest potential to check the operation.

When the data reading is judged possible, potentials supplied to word lines of the second row and the subsequent rows are set and operations are checked in the same manner. Potential settings and operation checks for all the word lines are completed finally. By a series of operations as described above, the potential of the word line can be optimized so as to operate the memory cells according to the read access time. In addition, when the operation within the set read access time is judged possible, the access time may be reset shorter and the operation in all the memory cells may be checked again. By using the above-described configuration, it is possible to pick out a shorter read access time within which data can be read from the memory cells.

Software performs these optimizations in accordance with the flowcharts described above. Further, optimizations can be performed for various applications only by rewriting the software. In the case where data stored in the memory is required, it is possible to transfer the data to another memory temporarily and replace it after the optimization.

Optimizations represented by FIGS. 2 and 3 may be performed before the shipment of a memory or a semiconductor device mounting the memory as a product, or when turning ON the semiconductor device mounting the memory after the shipment. In the case where the optimization is not performed after the shipment but before the shipment, a nonvolatile memory is used as a register. The optimization may be also performed when there is no access to the memory such as data writing or data reading.

Embodiment Mode 2

Explained in this embodiment mode are a DRAM of gain cell type, which is one of the memories of the present invention, and a method for setting a potential supplied to a memory cell of the DRAM.

Figure 4:
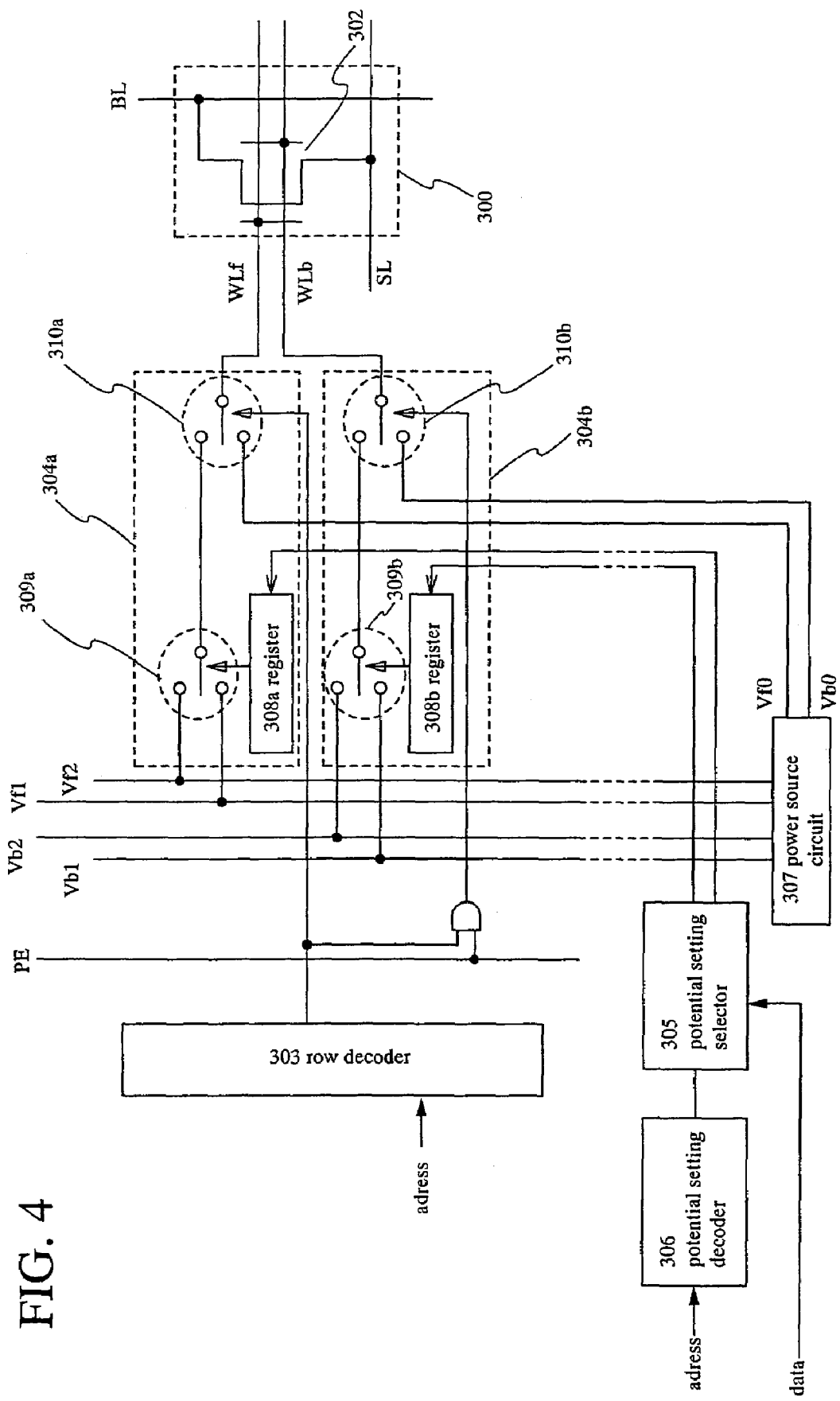
FIG. 4 is a configuration diagram of the memory unit of the present invention.

FIG. 4 shows a configuration of a memory according to this embodiment mode. Reference numeral 300 denotes one of memory cells provided in a cell array. Only one memory cell 300 is shown in FIG. 4, however, a plurality of memory cells 300 are provided in matrix in a cell array practically. In this embodiment mode, the memory cell 300 comprises a bit line BL, two word lines WLb and WLf, a source line SL, and a TFT 302 which serves as a memory element and a switching element.

Reference numeral 303 denotes a row decoder, 304a and 304b denote selection circuits, 305 denotes a potential setting selector, 306 denotes a potential setting decoder, and 307 denotes a power source circuit. The selection circuits 304a and 304b comprise registers 308a and 308b for storing selection data, switches 309a and 309b for selecting a potential to be supplied to the selection circuits 304a and 304b from the power source circuit 307, switches 310a and 310b for controlling the supply of the selected potential to the word lines WLf and WLb selected by the row decoder 303, respectively.

The selection circuits 304a and 304b are provided corresponding to the word lines WLf and WLb, respectively. According to this embodiment mode, three potentials Vf0, Vf1 and Vf2 are supplied to the selection circuit 304a corresponding to the word line WLf from the power source circuit 307. Three potentials Vb0, Vb1 and Vb2 are supplied to the selection circuit 304b corresponding to the word line WLb from the power source circuit 307. It is to be noted that, three potentials are supplied to each of the selection circuits 304a and 304b from the power source circuit 307 in this embodiment mode, however, the present invention is not limited to this. Two, four or more potentials may be supplied to each of the selection circuits 304a and 304b from the power source circuit 307.

The switches 309a and 309b are controlled by selection data stored in the register 308a and 308b, respectively. Specifically, the switch 309a selects either a potential Vf1 or Vf2 and the switch 309b selects either a potential Vb1 or Vb2. The switches 310a and 310b are controlled by a signal supplied from the row decoder 303 and a PE (Purge enable) signal.

Specifically, either the potential Vf0 or the potential Vf1 or Vf2 which is selected by the switch 309a is selected by the signal PE, and this selected potential is supplied to the word line WLf through the switch 310a selected by the row decoder 303. Either the potential Vb0 or the potential Vb1 or Vb2 which is selected by the switch 309b is selected by the signal PE, and this selected potential is supplied to the word line WLb through the switch 310b selected by the row decoder 303.

An address corresponding to each of the registers 308a and 308b is input to a memory chip, and the registers 308a and 308b are selected by the potential setting decoder 306 and the potential setting selector 305 and the input data is written thereto.

It is to be noted that, optimized are potentials to be supplied to the two word lines WLf and WLb in this embodiment mode, though a configuration of the present invention is not limited to this. Hardware such as a selection circuit, a power source circuit, a potential setting selector, and a potential setting decoder may be provided in a memory so that only one of the word lines WLf and WLb can be optimized. A potential supplied to the source line SL or the bit line BL may be optimized as well as the word lines WLf and WLb.

A structure of the TFT 302 included in the DRAM shown in FIG. 4 will be explained next.

Figure 5A:
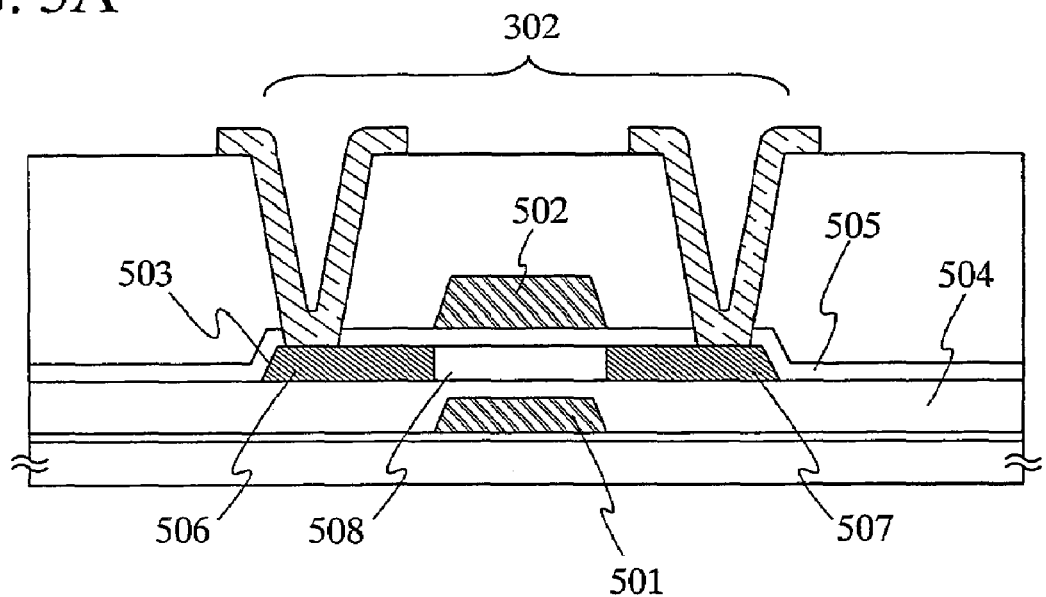
FIGS. 5A and 5B are cross-sectional views of a memory element provided in the memory cell shown in FIG. 4.

FIG. 5A is an example of a cross-sectional view of the TFT 302 shown in FIG. 4. The TFT 302 used as a memory element in this embodiment mode comprises two electrodes (hereinafter referred to as a first gate electrode 501 and a second gate electrode 502), an active layer 503, a first insulating film 504, and a second insulating film 505. The active layer 503 includes a source region 506, a drain region 507, and a channel forming region 508 sandwiched therebetween.

As shown in FIG. 5A, the active layer 503 is sandwiched between the first gate electrode 501 and the second gate electrode 502. The first insulating film 504 is sandwiched between the first gate electrode 501 and the active layer 503, and the second insulating film 505 is sandwiched between the second gate electrode 502 and the active layer 503.

A structure of the active layer 503 is not limited to the one shown in FIG. 5A. For example, one or a plurality of LDD (Light Doped Drain) regions or impurity regions which overlap with the first gate electrode 501 or the second gate electrode 502 may be included in the active layer 503. Alternatively, a structure in which a part of the channel forming region 508 does not overlap with the first gate electrode 501 or the second gate electrode 502 may be employed.

By potentials to be supplied to the first gate electrode 501, the second gate electrode 502, the source region 506, and the drain region 507, various operations of the DRAM can be controlled. According to this embodiment mode, data writing and data reading are performed in the above-mentioned TFT by using charge accumulation to the channel forming region accompanied by impact ionization. Specifically, impact ionization in data writing (Program) can be controlled by potentials supplied to the source region 506 and the drain region 507.

Figure 5B:
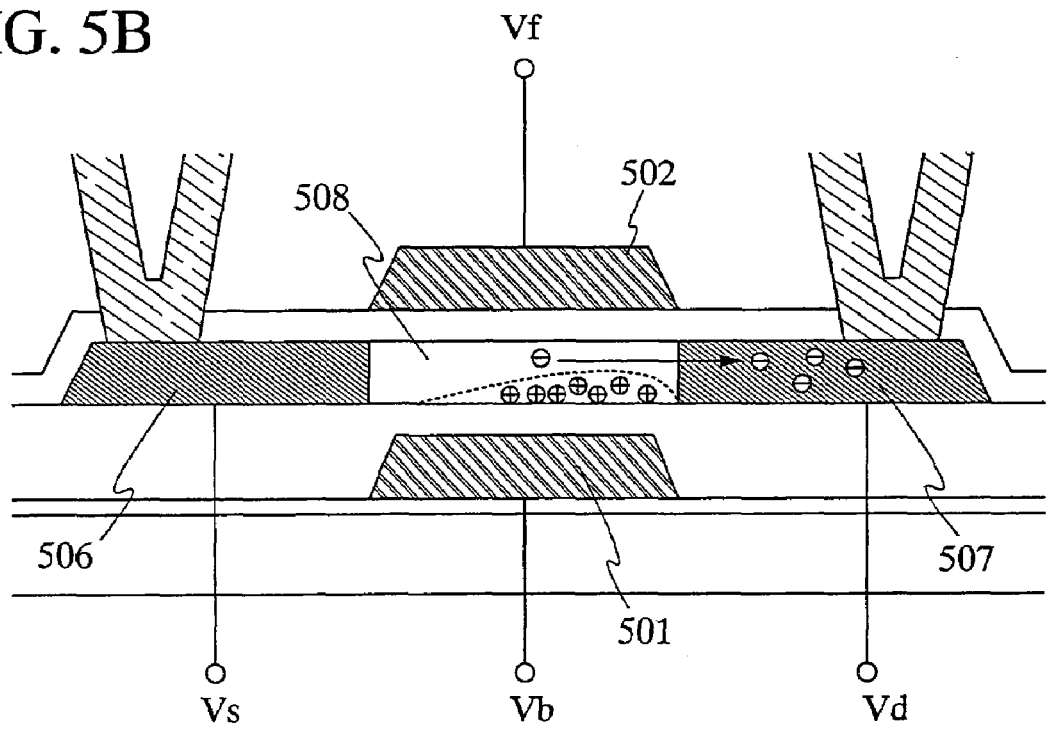

FIG. 5B shows a pattern diagram showing a state where holes are accumulated during impact ionization. FIG. 5B is an enlarged view of the TFT shown in FIG. 5A, in which the potential Vb is supplied to the first gate electrode 501 through the word line WLb and the potential Vf is supplied to the second gate electrode 502 through the word line WLf. In addition, a potential Vs is supplied to the source region 506 through the source line SL and a potential Vd is supplied to the drain region 507 through the bit line BL.

Impact ionization can be caused by raising a drain voltage (referred to as a Vds) which is obtained by subtracting the potential Vs of the source region 506 from the potential Vd of the drain region 507. The drain voltage Vds is adjusted so as to make an electric field high enough that carriers reach threshold energy of ionization. The value of the drain voltage Vds that causes impact ionization differs depending on the structure or characteristics of a TFT, specifically such as crystallinity or an impurity concentration of an active layer. According to the present invention, the value of the drain voltage Vds is set so that data can be written or read in accordance with variations in threshold voltage or drain current due to impact ionization.

When impact ionization occurs, electron-hole pairs are generated, and the generated electrons flow into the drain region, and the holes flow into the source region. Some of the holes are accumulated in the channel forming region 508 as indicated by '+' in FIG. 5B. By lowering a potential Vb of the first gate electrode 501 than a potential of Vs of the source region, the amount of holes to be accumulated can be controlled and further can be held.

When holes are accumulated, a potential at the first gate electrode 501 side of the channel forming region 508 is raised according to the amount of holes, whereby a threshold voltage of the TFT is increased as well as a drain current. Data can be read by utilizing the threshold voltage or the drain current that is changed according to the impact ionization. Each bit of data may have two states, or three or more states.

Next, a method for controlling a potential of a TFT for storing data at each operation will be explained using FIGS. 6A to 6D.

First, an operation in data writing (Program) is explained. FIG. 6A shows an example of a circuit diagram of a TFT and potentials supplied to each part in data writing. Note that, shown in FIG. 6A to 6D are examples in the case of storing data having two states to a DRAM.

In writing data, a gate voltage (referred to as a Vgs) which is obtained by subtracting a potential Vs of a source region from a potential Vf of a second gate electrode is set higher than a threshold voltage Vth of the TFT, and thereby turning the TFT ON. A drain voltage Vds is changed depending on whether holes are accumulated by impact ionization or not. In the case of accumulating holes by impact ionization, the drain voltage Vds is set equal to or higher than a voltage that causes impact ionization (referred to as a Vip here) as shown in a left diagram of FIG. 6A. On the other hand, in the case of accumulating no holes intentionally, the drain voltage Vds is set lower than the voltage Vip as shown in a right diagram of FIG. 6A. Then, in either case, a potential Vb of the first gate electrode is kept lower than the potential Vs of the source region so as to hold the state of charges in the channel forming region.

In FIG. 6A, it is assumed in the left diagram that Vs=0 V, Vd=5 V, Vb=−5 V, and Vf=3 V and in the right diagram that Vs=0 V, Vd=2 V, Vb=−5 V, and Vf=3 V.

FIG. 6B shows an example of a circuit diagram of a TFT and potentials supplied to each part in holding data (Hold) that has been written in FIG. 6A. In holding data, the gate voltage Vgs is set equal to or smaller than the threshold voltage Vth (Vgs≦Vth) so as to hold the written data, and thereby turning the TFT OFF. In order not to cause impact ionization while keeping the state of charge, the Vds is set approximately equal to 0 (Vds≈0), and the potential Vb of the first gate electrode is kept lower than the potential Vs of the source region.

In FIG. 6B, it is assumed that Vs=2 V, Vd=2 V, Vb=−5 V, and Vf=0 V.

FIG. 6C shows an example of a circuit diagram of a TFT and potentials supplied to each part in reading data (Read) that has been held in FIG. 6B. In reading data, the gate voltage Vgs is set higher than the threshold voltage Vth (Vgs>Vth) so as to read the held data, and thereby turning the TFT ON. In order to read the data without causing impact ionization while keeping the state of charge, the inequality of 0<Vds<Vip is satisfied and the potential Vb of the first gate electrode is kept lower than the potential Vs of the source region.

In FIG. 6 C, it is assumed that Vs=0 V, Vd=2 V, Vb=−5 V, and Vf=3 V.

Next, a purge operation (Purge) that is performed in rewriting or refreshing (Refresh) data is explained. FIG. 6D shows an example of a circuit diagram of a TFT and potentials supplied to each part in purge operation. In purging, the gate voltage Vgs is set higher than the threshold voltage Vth (Vgs>Vth) to release the held charges, and thereby turning the TFT ON. In order to release charges without causing impact ionization, the inequality of 0<Vds<Vip is satisfied. It is to be noted that, the potential Vb of the first gate electrode is desirably set higher than that in writing, holding, and reading data. More desirably, the potential Vb of the first gate electrode is set equal to or higher than the potential Vs of the source region (Vb≧Vs) though it is not essential since charges can be released when a high potential is supplied to the potential Vf even in the case where the potential Vb of the first gate electrode is kept lower than the potential Vs of the source region. However, by setting to be the inequality of Vb≧Vs, the charge release at a high speed and the timesaving of the purge operation can be realized.

In FIG. 6D, it is assumed that Vs=0 V, Vd=2 V, Vb=0 V, and Vf=3 V.

As described above, a series of operations including writing, reading, holding, and purging can be performed by using a TFT. It is to be noted that, the specific values of Vs, Vd, Vb, and Vf shown in FIGS. 6A to 6D are only examples, and the present invention is not limited to these. In addition, when optimizing the potentials of the word lines WLf and WLb as shown in FIG. 4, operation conditions such as lower power consumption, higher speed in writing, reading and purging, and longer holding time can be satisfied.

Each of the above-described operations in a memory cell array comprising a plurality of memory cells is explained next using FIGS. 7A and 7B.

Figure 7A:
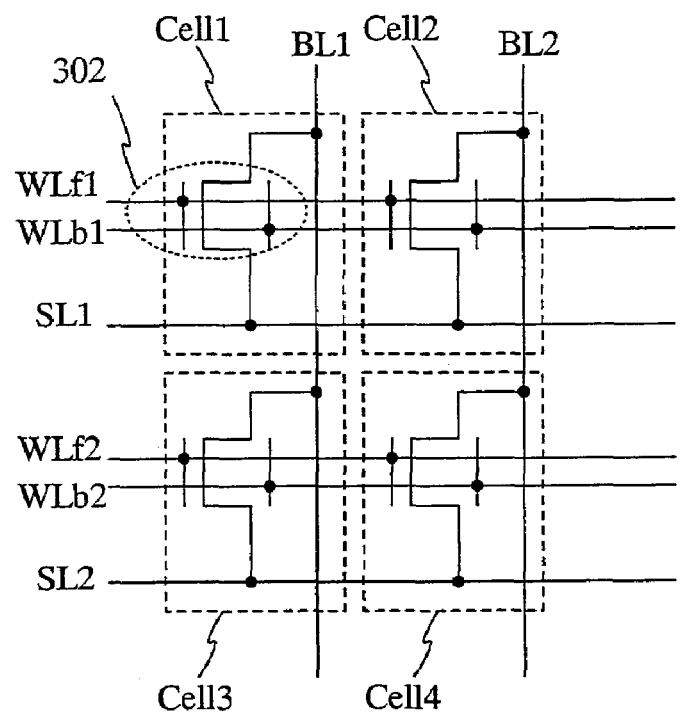
FIGS. 7A and 7B are a configuration and a timing chart of a cell array included in the memory unit shown in FIG. 4.

First, an example of wiring connections between each memory cell is shown in FIG. 7A. FIG. 7A shows a circuit diagram of a cell array having four memory cells (Cell1, Cell2, Cell3, and Cell4), each of which comprises a TFT 302 for storing data. Although the four memory cells are disposed in the memory cell array in FIG. 7A, the number of memory cells is, needless to mention, not limited to this.

The TFT 302 in each memory cell receives potentials Vb and Vf from two word lines WLb and WLf respectively, a potential Vd from a bit line BL, and a potential Vs from a source line SL. Note that, the layout of each wiring is not limited to that shown in FIG. 7A.

Specifically, in FIG. 7A, the memory cell (Cell1) corresponds to word lines WLb1 and WLf1, a bit line BL1, and a source line SL1, and the memory cell (Cell2) corresponds to the word lines WLb1 and WLf1, a bit line BL2, and the source line SL1. The memory cell (Cell3) corresponds to word lines WLb2 and WLf2, the bit line BL1, and a source line SL2, and the memory cell (Cell4) corresponds to the word lines WLb2 and WLf2, the bit line BL2, and the source line SL 2.

Figure 7B:
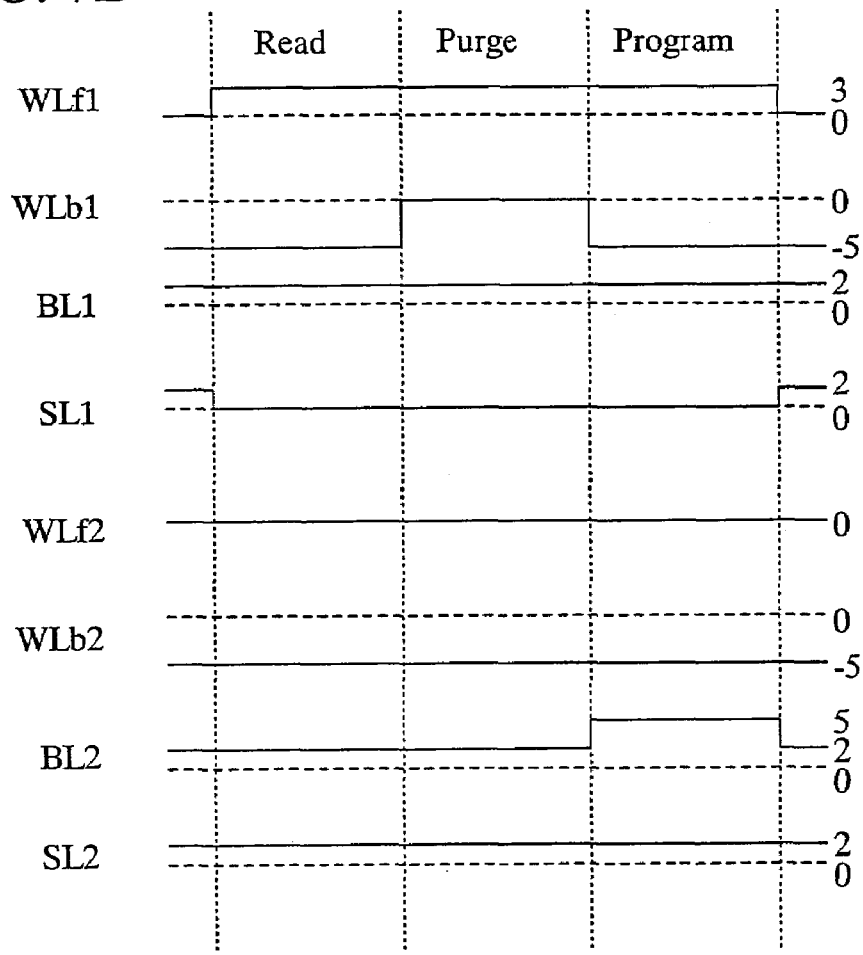

FIG. 7B shows an example of a timing chart in which the memory cells (Cell1) and (Cell2) in the first row are refreshed.

Refresh operation is carried out in order to prevent data, which is stored in a memory cell, from being lost as the time passes. Specifically, data that is stored in the memory cell is read once and rewritten into the same memory cell. Refresh operation needs to be carried out at a regular interval. According to the present invention, the interval is determined based on the holding time of holes that are accumulated in a channel forming region of a transistor Refresh operation according to the present invention is performed by a series of operations including reading, purging and writing. Purge operation is an operation in which holes accumulated in a channel forming region of a transistor are all released, thereby resetting the state of a memory cell.

According to the present invention, the memory cells sharing the word line WLb, namely one row of memory cells are purged all at once. On the other hand, writing and reading can be performed per memory cell, or per row of memory cells at the same time in the same manner as the purge operation. Therefore, according to the present invention, reading and writing are performed per bit in accordance with a bus width, or per row of memory cells and the like, while refresh operation is performed per row of memory cells.

The relationship among potentials Vs, Vd, Vb, and Vf supplied to each memory cell at each period in FIG. 7B can be explained with reference to the above-mentioned description using FIG. 6A to 6D. Data firstly read is once stored in a latch circuit, and then rewritten to a memory cell after purging. In this embodiment mode, data is written so that the memory cell (Cell1) will have a state in which no holes are accumulated, and the memory cell (Cell2) will have a state in which holes are accumulated. It is to be noted that, a potential supplied to the memory cell (Cell4) is also changed by the BL2 (stress in writing) in writing, and what is important here is that a potential is set so that the holes accumulated in the memory cell (Cell4) are not influenced by this potential change.

It is also to be noted that, when writing data immediately after turning ON the switch, there may be cases where charges are already accumulated due to heat, static electricity, or the like, therefore, data is desirably written after purging.

Differently from a DRAM with a typical configuration utilizing a capacitor, a DRAM according to this embodiment mode can read data without writing again, since the charge accumulated state can be kept for some time even after reading data by a drain current. Therefore, when the same data is required, the number of times of writing repeatedly can be reduced, leading to lower power consumption of a DRAM. Instead, when another data is overwritten after writing data once, it is necessary to increase a potential at a first gate electrode and purge the accumulated charges, thereby clearing the previous data completely before writing data.

When a thin film transistor is compared to a transistor formed by using a single crystalline semiconductor film, it is generally thought that charges are easily leaked out due to a grain boundary in an active layer, leading to a short holding time of charges. However, as for a transistor formed by using a single crystalline semiconductor film, the conventional process has to be made a drastic change in forming two gate electrodes interposing an active layer, thereby leading to more complicated steps and higher cost. In view of these problems, the embodiment mode uses a semiconductor film, which is crystallized by means of a metal catalyst, as an active layer of a thin film transistor. It has been verified that in a semiconductor film crystallized by means of metal catalyst, two different crystal grains are joined with very good matching at the grain boundary as disclosed in Japanese Patent Laid-Open No. 2001-5426. In other words, the film has a structure in which crystal lattices are continuously joined at the crystal grain boundary, and it is very hard to create trap levels caused by crystal defects and the like. Therefore, there are few regions to become a growth nucleus of an electron-hole pair, and thus a thin film transistor having high charge retention characteristics can be realized. Also, a step for forming the second gate electrode can be added with ease without complicating the steps as compared to the case of a single crystalline transistor. Therefore, cost rise with the complicated steps can be suppressed unlike the case of forming a single crystalline transistor.

It is to be noted that, a thin film transistor of the embodiment mode is an SOI (silicon on insulator) of complete depletion type. The complete depletion type SOI transistor can be realized with a thin active layer, and a depletion layer spreads widely in the active layer. A single crystalline SOI substrate has a problem in that it cannot easily provide a very thin single crystalline silicon film, whereas a thin film transistor can easily provide a thin active layer by depositing a semiconductor layer.

In addition, in the semiconductor film which is crystallized by means of a metal catalyst, characteristic variations of a thin film transistor for holding charges can be decreased since the size and crystal orientation of crystal grains are relatively uniform as compared to those formed by other crystallization. Further, by optimizing a potential to be supplied to a memory cell, there is no need of adjusting an operation condition of all memory cells to a memory cell whose characteristic is most deteriorated according to the present invention when characteristics of all memory cells are varied. Consequently, too high power consumption or deterioration of an element in a memory cell caused by supplying too high or too low potential can be prevented.

According to this embodiment mode, data can be stored by using one thin film transistor, thus no additional capacitor is required and a memory cell area can be reduced as described above. Therefore, high integration and large capacity of a semiconductor device mounting a DRAM can be realized while cutting costs. Further, according to the high integration and large capacity of the semiconductor device, more semiconductor devices can be integrally formed on the same substrate as a pixel portion of a flat panel display, thus high-performance system-on-panel can be implemented.

It is to be noted that, according to this embodiment mode, a DRAM can be operated by providing at least one thin film transistor for each memory cell, however, the number of thin film transistors is not limited to this, and a plurality of transistors may also be employed for each memory cell. For example, not only a thin film transistor for storing data, but also a thin film transistor used for switching may be provided so that the data stored in the former thin film transistor can be hold more surely. However, the thin film transistor used for switching may not necessarily be of a dual gate type, and a single gate thin film transistor that has a gate only in either side of an active layer may also be employed.

The memory of the present invention is not limited to a DRAM of a gain cell type as shown in FIG. 4. The wire that a potential optimization is performed is not also limited to the word line.

Embodiment 1

Explained in this embodiment is a case where a plurality of potentials to be supplied to a selection circuit from a power source circuit are optimized as well as a potential to be supplied to a memory cell.

Figure 8:
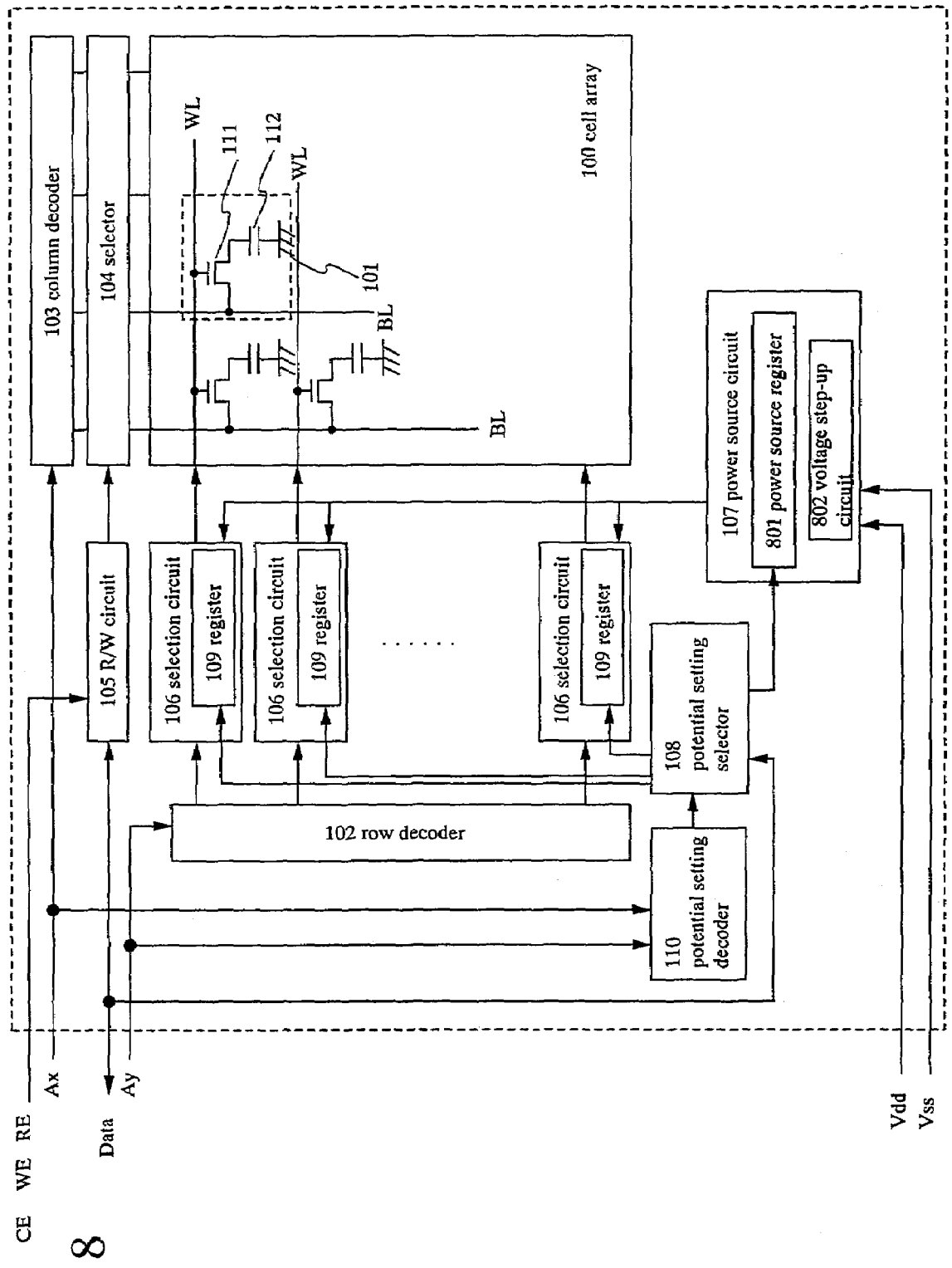
FIG. 8 is a configuration diagram of the memory unit of the present invention.

FIG. 8 shows a configuration of a memory according to this embodiment. FIG. 8 is the memory based on FIG. 1 in which a function for optimizing a plurality of potentials to be supplied to a selection circuit from a power source circuit is additionally provided. The components already shown in FIG. 1 are denoted by the same reference numerals in FIG. 8. The memory shown in FIG. 8 is a DRAM, though the memory according to this embodiment is not limited to this. In addition, an embodiment mode of optimizing a potential of a word line is shown in FIG. 8 as well as in FIG. 1, however, the memory according to this embodiment is not limited to this.

In the memory shown in FIG. 8, a power source circuit 107 includes a register for selecting a potential to be supplied to a selection circuit 106 from the power source circuit 107. The register in the power source circuit 107 is hereinafter referred to as a power source register 801 in distinction to a register 109 in the selection circuit 106. Stored in the power source register 801 is data (hereinafter, referred to as power source data) for determining a plurality of potentials to be supplied to the selection circuit 106 from the power source circuit 107.

Rewrite of the power source data stored in the power source register 801 can be controlled by a potential setting decoder 110 and a potential setting selector 108. The power source circuit 107 supplies the plurality of potentials, which have been determined by the rewritten power source data to the selection circuit 106. It is to be noted that, a voltage step-up circuit 802 may be provided in the power source circuit 107 of this embodiment so that a power source potential Vdd supplied to the memory is increased before generating a required potential. By employing the above-mentioned configuration, the variation of a potential that can be output from the power source circuit 107 can be increased.

When characteristics of a memory cell are too deteriorated, for example, to operate in a desired operation condition by any potential output from the power source circuit, the above-mentioned configuration according to this embodiment resets the potential output from the power source circuit and the operation in a desired operation condition can be realized.

Embodiment 2

A configuration of a microprocessor, one of semiconductor devices according to the present invention will be described in this embodiment.

Figure 9:
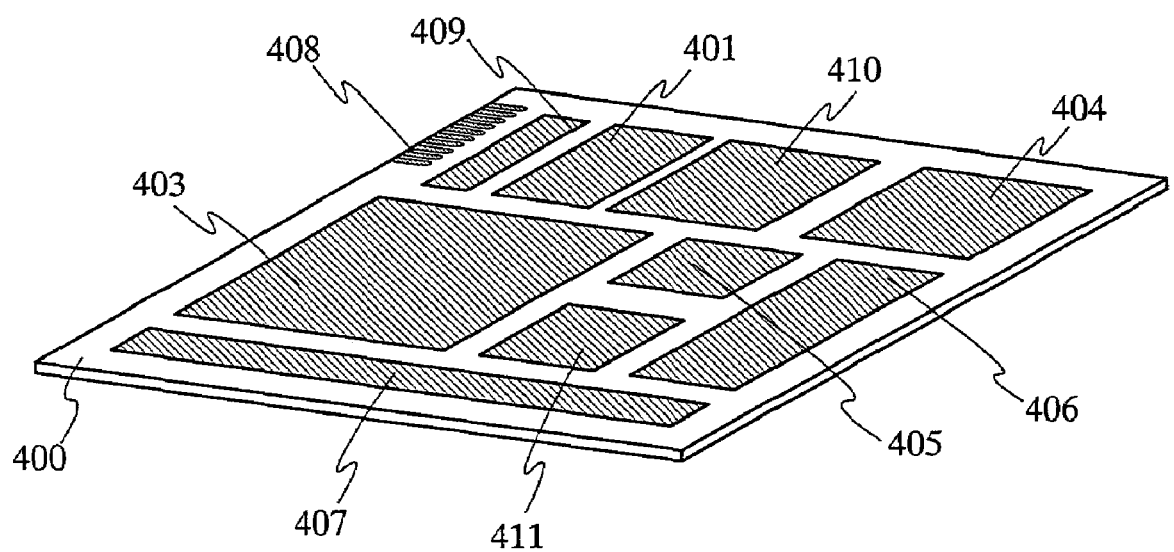
FIG. 9 is a view showing an embodiment mode of a semiconductor device of the present invention.

FIG. 9 is a perspective view of a microprocessor according to this embodiment. The microprocessor in FIG. 9 includes a substrate 400, and on the substrate 400 formed are a CPU 401, a main memory 403, a clock controller 404, a cache controller 405, a serial interface 406, an I/O port 407, a terminal 408, an interface 409, a cache memory 410, a sub memory 411 and the like. Needless to say, the microprocessor in FIG. 9 is just an example with the simplified configuration and actually, a microprocessor may have various types of configurations in accordance with the intended use.

In order to operating a CPU at a high speed, required is a memory capable of operating at a high speed enough to accommodate the CPU operation. However, it is in general very expensive to utilize a high-speed and large-capacitance memory that has an access time corresponding to the operating speed of the CPU 401. Thus, the cache memory 410, which has a small capacitance and operates at a high speed by comparison to the main memory 403, is intervened between the CPU 401 and the main memory 403. By accessing the cache memory 410, the CPU 401 is capable of operating at a high speed without depending on the operating speed of the main memory 403.

A DRAM that contributes to the cost reduction and the increase in capacitance is preferably utilized as the main memory 403, and an SRAM that is capable of operating at a high speed is preferably utilized as the cache memory 410. The memory according to the present invention can be utilized for any memory such as the main memory 403 and the cache memory 410.

In this embodiment, stored in the sub memory 411 is a program for the optimization of a potential supplied to a memory cell, which is used in the memory of the present invention. For example, it is assumed here that the main memory 403 is the memory according to the present invention having hardware for the potential optimization. The CPU 401 controls the operation of the hardware in the main memory 403 in accordance with the program stored in the sub memory 411 to optimize the potential. Described in this embodiment is the case where a program for the potential optimization is stored in a sub memory, however, the present invention is not particularly limited to this configuration. For example, in the case where the potential optimization in the main memory is completed before the shipment as a product, a memory for storing a program for the potential optimization is no longer required after the shipment, and thus the program can be supplied from the external of the memory unit to perform the optimization.

In addition, stored in the main memory 403 is a program to be executed in the CPU 401. For example, in the initial run time, the program stored in the main memory 403 is downloaded into the cache memory 410. Not only the program stored in the main memory 403 but also programs stored in other external memories may be downloaded. The cache memory 410 functions as a work region as well as stores the program to be executed in the CPU 401, and temporarily stores calculation results and the like of the CPU 401.

The number of CPUs is not limited to one, and a plurality of CPUs may be provided. The operating speed can be enhanced by providing a plurality of CPUs and processing in parallel. When the processing speed between the CPUs varies, the inconvenience may occur in viewing the processing as a whole. Therefore, the balance of the processing speed between each CPU that serves as a slave may be adjusted by means of the CPU that serves as the master.

The microprocessor is shown as an example of a semiconductor device in this embodiment, however, the application of a memory utilized in a semiconductor device of the present invention is not limited to the one shown in this embodiment. For example, the memory of the present invention is preferably applied to a video RAM utilized in a driver circuit of a display device, to a bulk memory that is required for an image processing circuit, and to various system LSIs.

Embodiment 3

A semiconductor device or a memory unit of the present invention can be applied to various electronic devices such as a video camera, a digital camera, a goggle type display (head mount display), a navigation system, a sound reproduction device (car audio, audio component and the like), a laptop personal computer, a game device, a portable information terminal (mobile computer, portable phone, portable game device or a digital book and the like), an image reproduction device with a recording medium (specifically a device with a display which plays the recording medium such as Digital Versatile Disc (DVD) and displays an image thereof. Specific examples of the electronic devices are shown in FIGS. 10A to 10C.

Figure 10A:
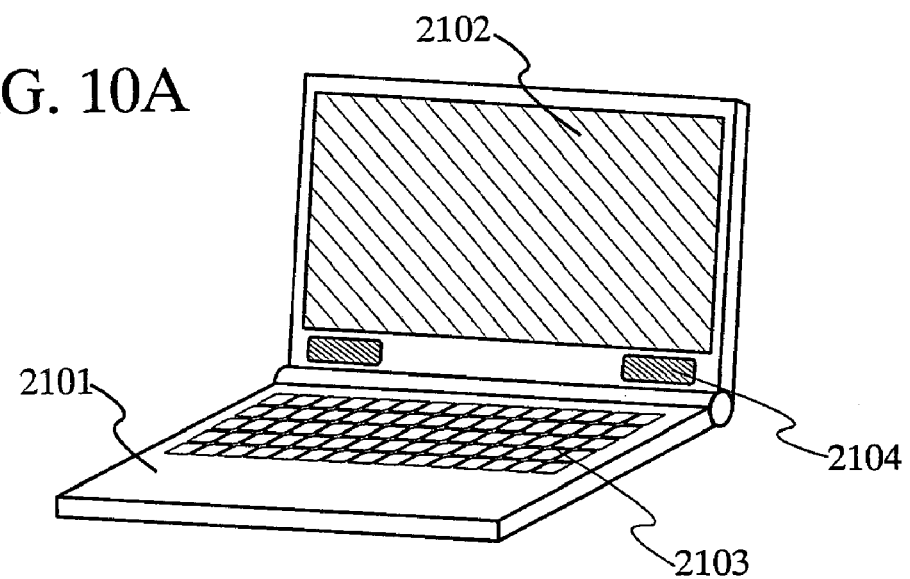
FIGS. 10A to 10C are views of electronic devices to which the semiconductor device of the present invention is applied.

FIG. 10A shows a portable information terminal (PDA) which includes a body 2101, a display portion 2102, a operation key 2103, a speaker portion 2104 and the like. The semiconductor device of the present invention can be applied to the display portion 2102 and a signal processing circuit.

Figure 10B:
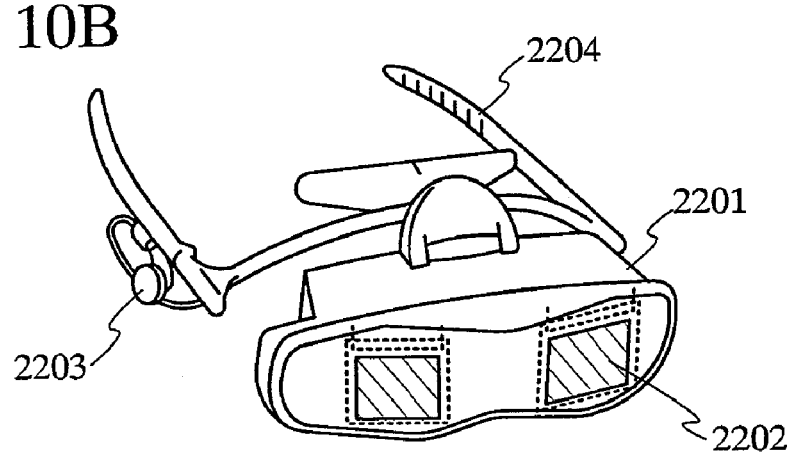

FIG. 10B shows a goggle type display device which includes a body 2201, a display portion 2202, an earphone 2203, and an arm portion 2204. The semiconductor device of the present invention can be applied to the display portion 2202 and a signal processing circuit other than the display portion 2202. The arm portion 2204 may be for fixing the goggle type display device to the head itself or to a part of the user's body except the head.

Figure 10C:
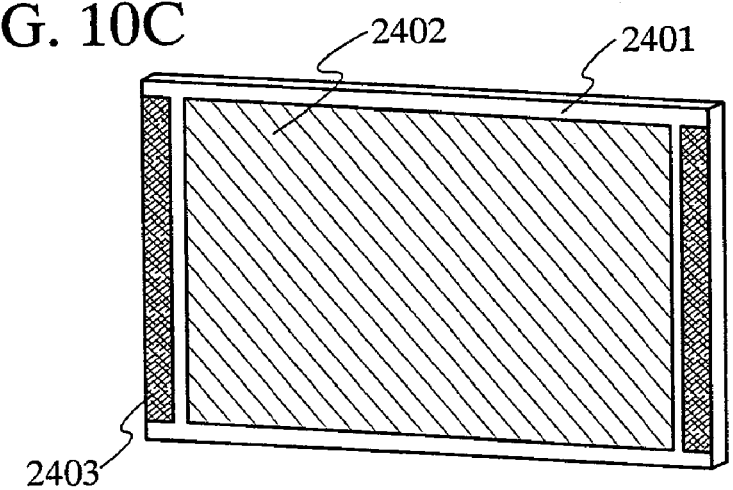

FIG. 10C shows a display device which includes a housing 2401, a display portion 2402, a speaker portion 2403 and the like. The semiconductor device of the present invention can be applied to the display portion 2402 and a signal processing circuit. All information display devices such as for a personal computer, for a TV broadcast receiver, and for an advertisement display are included in a display device.

As described above, the application range of the present invention is so wide that the invention is applicable to a semiconductor device of all fields. The electronic devices in this embodiment can be composed of a semiconductor device having any one of configurations described in Embodiments 1 to 3.

This application is based on Japanese Patent Application serial no. 2003-148181 filed in Japan Patent Office on 26, May, 2003, the contents of which are hereby incorporated by reference.

Although the invention has been fully described by way of Embodiment Modes and with reference to the accompanying drawings, it is to be understood that various changes and modifications will be apparent to those skilled in the art. Therefore, unless such changes and modifications depart from the scope of the invention hereinafter defined, they should be constructed as being included therein.

What is claimed is:

1. A driving method of a memory unit comprising:
supplying a plurality of potentials to a selection circuit by a power source circuit,
selecting a potential among the plurality of potentials in accordance with data stored in a memory circuit included in the selection circuit,
supplying the potential to a memory cell by the selection circuit in accordance with a signal output from a driving circuit, and
rewriting the data stored in the memory circuit to change a potential of a word line.

2. The driving method of a memory unit according to claim 1, wherein the memory cell includes a SOI transistor.

3. The driving method of a memory unit according to claim 1, wherein the memory cell includes a transistor.

4. The driving method of a memory unit according to claim 1, wherein the memory cell includes a transistor, and wherein the transistor includes an active layer, and first and second electrodes overlapping with each other with the active layer interposed therebetween.

5. The driving method of a memory unit according to claim 1, the memory unit is at least one selected from the group consisting of a Dynamic Random Access Memory, an SRAM, a masked ROM, an EPROM, an EEPROM, a flash memory, and a ferroelectric memory.

6. An electronic device using the driving method of a memory unit according to claim 1.

7. A driving method of a memory unit comprising:
supplying a plurality of potentials to a selection circuits by a power source circuit,
writing data to a memory circuit included in the selection circuit by a decoder and a selector,
selecting a potential among the plurality of potentials in accordance with the data stored in the memory circuit,
supplying the potential to a memory cell by the selection circuit in accordance with a signal output from a driving circuit, and
rewriting the data stored in the memory circuit to change a potential of a word line.

8. The driving method of a memory unit according to claim 7, wherein the memory cell includes a SOI transistor.

9. The driving method of a memory unit according to claim 7, wherein the memory cell includes a transistor.

10. The driving method of a memory unit according to claim 7, wherein the memory cell includes a transistor, and wherein the transistor includes an active layer, and first and second electrodes overlapping with each other with the active layer interposed therebetween.

11. The driving method of a memory unit according to claim 7, the memory unit is at least one selected from the group consisting of a Dynamic Random Access Memory, an SRAM, a masked ROM, an EPROM, an EEPROM, a flash memory, and a ferroelectric memory.

12. An electronic device using the driving method of a memory unit according to claim 7.

13. A driving method of a memory unit comprising:
supplying a plurality of potentials to each of a plurality of selection circuits by a power source circuit,
selecting a memory circuit included in one of the plurality of selection circuits and writing data to the selected memory circuit by a decoder and a selector,
selecting a potential among the plurality of potentials in accordance with the data stored in the selected memory circuit,
supplying the potential to a memory cell by the one of the plurality of selection circuits in accordance with a signal output from a driving circuit, and
rewriting the data stored in the memory circuit by the decoder and the selector to change a potential of a word line.

14. The driving method of a memory unit according to claim 13, wherein the memory cell corresponds to the one of the plurality of selection circuits.

15. The driving method of a memory unit according to claim 13, wherein the memory cell includes a SOI transistor.

16. The driving method of a memory unit according to claim 13, wherein the memory cell includes a transistor.

17. The driving method of a memory unit according to claim 13, wherein the memory cell includes a transistor, and wherein the transistor includes an active layer, and first and second electrodes overlapping with each other with the active layer interposed therebetween.

18. The driving method of a memory unit according to claim 13, the memory unit is at least one selected from the group consisting of a Dynamic Random Access Memory, an SRAM, a masked ROM, an EPROM, an EEPROM, a flash memory, and a ferroelectric memory.

19. An electronic device using the driving method of a memory unit according to claim 13.

20. A driving method of a memory unit comprising:
supplying a plurality of potentials to each of a plurality of selection circuits by a power source circuit,
selecting a memory circuit included in one of the plurality of selection circuits and writing data to the selected memory circuit by a decoder and a selector,
selecting a potential among the plurality of potentials in accordance with the data stored in the selected memory circuit,
supplying the potential to a memory cell corresponding to the one of the plurality of selection circuits by the one of the plurality of selection circuits in accordance with a signal output from the driving circuit, and
selecting whether another potential is selected among the plurality of potentials by the selection circuit by rewriting data or the data is no longer rewritten by the selector depending on an operating state of the corresponding memory cell by utilizing a program by a CPU.

21. The driving method of a memory unit according to claim 20, wherein the memory cell includes a SOI transistor.

22. The driving method of a memory unit according to claim 20, wherein the memory cell includes a transistor.

23. The driving method of a memory unit according to claim 20, wherein the memory cell includes a transistor, and wherein the transistor includes an active layer, and first and second electrodes overlapping with each other with the active layer interposed therebetween.

24. The driving method of a memory unit according to claim 20, the memory unit is at least one selected from the group consisting of a Dynamic Random Access Memory, an SRAM, a masked ROM, an EPROM, an EEPROM, a flash memory, and a ferroelectric memory.

25. An electronic device using the driving method of a memory unit according to claim 20.

26. A driving method of a semiconductor device comprising:
supplying a plurality of potentials to a selection circuit by a power source circuit,
selecting a potential among the plurality of potentials in accordance with data stored in a memory circuit included in the selection circuit,
supplying the potential to a memory cell by the selection circuit in accordance with a signal output from a driving circuit, and
rewriting the data stored in the memory circuit to change a potential of a word line.

27. The driving method of a semiconductor device according to claim 26, wherein the memory cell includes a SOI transistor.

28. The driving method of a semiconductor device according to claim 26, wherein the memory cell includes a transistor.

29. The driving method of a semiconductor device according to claim 26, wherein the memory cell includes a transistor, and wherein the transistor includes an active layer, and first and second electrodes overlapping with each other with the active layer interposed therebetween.

30. The driving method of a semiconductor device according to claim 26, the semiconductor device is at least one selected from the group consisting of a Dynamic Random Access Memory, an SRAM, a masked ROM, an EPROM, an EEPROM, a flash memory, and a ferroelectric memory.

31. An electronic device using the driving method of a semiconductor device according to claim 26.

32. A driving method of a semiconductor device comprising:
supplying a plurality of potentials to a selection circuits by a power source circuit,
writing data to a memory circuit included in the selection circuit by a decoder and a selector,
selecting a potential among the plurality of potentials in accordance with the data stored in the memory circuit,
supplying the potential to a memory cell by the selection circuit in accordance with a signal output from a driving circuit, and
rewriting the data stored in the memory circuit to change a potential of a word line.

33. The driving method of a semiconductor device according to claim 32, wherein the memory cell includes a SOI transistor.

34. The driving method of a semiconductor device according to claim 32, wherein the memory cell includes a transistor.

35. The driving method of a semiconductor device according to claim 32, wherein the memory cell includes a transistor, and wherein the transistor includes an active layer, and first and second electrodes overlapping with each other with the active layer interposed therebetween.

36. The driving method of a semiconductor device according to claim 32, the semiconductor device is at least one selected from the group consisting of a Dynamic Random Access Memory, an SRAM, a masked ROM, an EPROM, an EEPROM, a flash memory, and a ferroelectric memory.

37. An electronic device using the driving method of a semiconductor device according to claim 32.

38. A driving method of a semiconductor device comprising:
- supplying a plurality of potentials to each of a plurality of selection circuits by a power source circuit,
- selecting a memory circuit included in one of the plurality of selection circuits and writing data to the selected memory circuit by a decoder and a selector,
- selecting a potential among the plurality of potentials in accordance with the data stored in the selected memory circuit,
- supplying the potential to a memory cell by the one of the plurality of selection circuits in accordance with a signal output from a driving circuit, and
- rewriting the data stored in the memory circuit by the decoder and the selector to change a potential of a word line.

39. The driving method of a semiconductor device according to claim 38, wherein the memory cell corresponds to the one of the plurality of selection circuits.

40. The driving method of a semiconductor device according to claim 38, wherein the memory cell includes a SOI transistor.

41. The driving method of a semiconductor device according to claim 38, wherein the memory cell includes a transistor.

42. The driving method of a semiconductor device according to claim 38, wherein the memory cell includes a transistor, and wherein the transistor includes an active layer, and first and second electrodes overlapping with each other with the active layer interposed therebetween.

43. The driving method of a semiconductor device according to claim 38, the semiconductor device is at least one selected from the group consisting of a Dynamic Random Access Memory, an SRAM, a masked ROM, an EPROM, an EEPROM, a flash memory, and a ferroelectric memory.

44. An electronic device using the driving method of a semiconductor device according to claim 38.

45. A driving method of a semiconductor device comprising:
- supplying a plurality of potentials to each of a plurality of selection circuits by a power source circuit,
- selecting a memory circuit included in one of the plurality of selection circuits and writing data to the selected memory circuit by a decoder and a selector,
- selecting a potential among the plurality of potentials in accordance with the data stored in the selected memory circuit,
- supplying the potential to a memory cell corresponding to the one of the plurality of selection circuits by the one of the plurality of selection circuits in accordance with a signal output from the driving circuit, and
- selecting whether another potential is selected among the plurality of potentials by the selection circuit by rewriting data or the data is no longer rewritten by the selector depending on an operating state of the corresponding memory cell by utilizing a program by a CPU.

46. The driving method of a semiconductor device according to claim 45, wherein the memory cell includes a SOI transistor.

47. The driving method of a semiconductor device according to claim 45, wherein the memory cell includes a transistor.

48. The driving method of a semiconductor device according to claim 45, wherein the memory cell includes a transistor, and wherein the transistor includes an active layer, and first and second electrodes overlapping with each other with the active layer interposed therebetween.

49. The driving method of a semiconductor device according to claim 45, the semiconductor device is at least one selected from the group consisting of a Dynamic Random Access Memory, an SRAM, a masked ROM, an EPROM, an EEPROM, a flash memory, and a ferroelectric memory.

50. An electronic device using the driving method of a semiconductor device according to claim 45.

* * * * *